March 8, 1966 C. C. RAYBURN 3,238,597

METHOD OF MAKING A MINIATURE WOUND CAPACITOR

Filed Nov. 9, 1961 2 Sheets-Sheet 1

INVENTOR.
Charles C. Rayburn
BY
ATT'Y.

METHOD OF MAKING A MINIATURE WOUND CAPACITOR
Filed Nov. 9, 1961 2 Sheets-Sheet 2
Fig.8
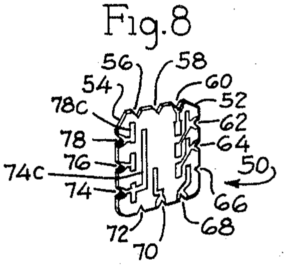
Fig.9
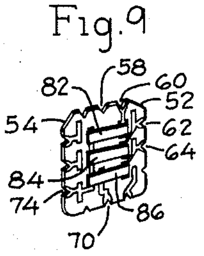
Fig.10
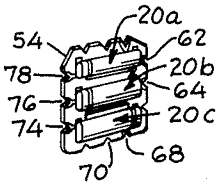
Fig.8A Fig.10A
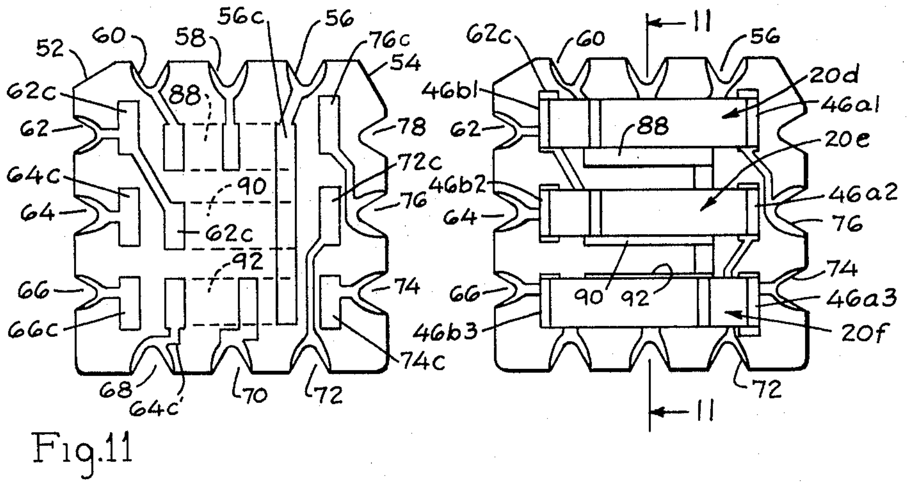
Fig.11
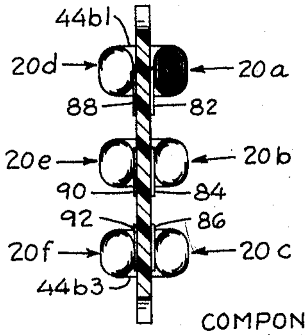
Fig.12
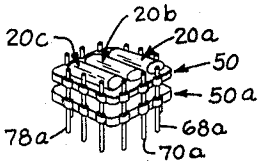
Fig.13
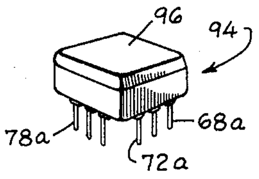
Fig.14
COMPONENTS
| NOTCHES | 82 | 84 | 86 | 86a | 86b | 88 | 88a | 88b | 90 | 92 | 92a | 92b | 20a | 20b | 20c | 20d | 20e | 20f |
|---|---|---|---|---|---|---|---|---|---|---|---|---|---|---|---|---|---|---|
| 56 | | | | | | X | X | | X | X | X | | | | | | | |
| 58 | | | | | | | X | X | | | | | | | | | | |
| 60 | X | | | | | X | | X | | | | | | | | | | |
| 62 | | X | | | | | | | X | | | | X | | | X | | |
| 64 | | | X | X | | | | | | | | | | X | | | X | |
| 66 | | | | | | | | | | | | | | | | | | X |
| 68 | | | | | | | | | | | X | X | | | X | | | |
| 70 | | | | X | X | | | | | X | | X | | | | | | |
| 72 | | | | | | | | | | | | | | | | | X | |
| 74 | X | X | X | | X | | | | | | | | | | X | | | X |
| 76 | | | | | | | | | | | | | | X | | X | | |
| 78 | | | | | | | | | | | | | X | | | | | |
INVENTOR.
Charles C. Rayburn
BY Robert D. Silver
ATT'Y.

3,238,597
METHOD OF MAKING A MINIATURE WOUND CAPACITOR

Charles C. Rayburn, Falls Church, Va., assignor to Illinois Tool Works Inc., Chicago, Ill., a corporation of Delaware Filed Nov. 9, 1961, Ser. No. 151,228
4 Claims. (Cl. 29—25.42)

This invention relates in general to the method of making a miniature wound capacitor and mounting same over a resistor on a modular wafer in a manner utilizing common terminals and the structure so formed. The miniature capacitor also has a separate usefulness.

There are two basic materials on which multicomponent assemblies are constructed—high dielectric constant or low dielectric constant substrates. Low dielectric constant materials are used if minimum coupling is desired between components. In other systems, the substrate participates directly as the dielectric, forming various capacitances required by the circuit. In both cases, resistors of a two dimensional variety are bonded to the substrate. The substrate not only provides the resistor with electrodes and leads but also provides the heat sink for power dissipation. Other component types may be added and interconnected on the surface of either type of base material.

This invention constitutes an improvement on the multicomponent module system originally developed as project Tinker Toy. In project Tinker Toy the module wafer per se was developed, said wafer being basically rectilinear, thin, and having a plurality of notches in the side edges which are adapted to be metallized and connected to riser wires which fit into the notches. There are at present three basic sizes of modules, namely, the so-called standard wafer which is approximately ⅞ of an inch on a side; the so-called miniature wafer which is approximately ½ of an inch on the side; and the so-called micro-module which is approximately ⅓ of an inch on a side. All three modules are essentially similar although different orientation means for the wafers are generally provided.

Various components have been mounted on wafers heretofore, and have included such items as tube sockets, resistors, capacitors, and inductors of various types. In more recent times there have been increasing pressures for high density construction of electronic components. In general, the ideal is to have a high density of components in the smallest possible area which give high reliability and lowest possible cost. Resistors and capacitors which utilize the module wafer structure as an integral part of the overall component are particularly well adapted to fitting the requirement of high reliability, high component density, and low cost.

At the start of the project Tinker Toy, it was thought that ceramic capacitors would be best adapted toward utilization with the wafers. However, upon analyzation, it has been discovered that so-called rolled Mylar film (registered trademark for polyethylene terephthalate films) capacitors have certain advantages over ceramic capacitors. The major advantages of Mylar film type capacitors are that they can be manufactured in almost any desired range including the low range normally thought to be the exclusive realm of the ceramic capacitors. (One technique for producing low value wound capacitors is shown in my Patent No. 2,949,570 issuing August 16, 1960.) Further, Mylar capacitors do not have the problems of thermoshock and breakage which are associated with ceramic capacitors. Another factor in favor of Mylar capacitors is that rather high power dissipation (up to two (2) watts per wafer) naturally elevates the module wafer temperatures causing high dielectric constant ceramics with high temperature coefficients to produce circuit problems if applied in sensitive positions. The relatively flat Mylar temperature coefficients of capacitance are a big advantage in this regard. One other advantage of the Mylar capacitors relative to the ceramic capacitors is that the ceramic capacitors when mounted on a wafer not only required a large metallized area, under which no other circuits could run, but further required a common electrode for mounting two stack capacitors per wafer surface. Thus, a wafer surface got poor utilization.

The problem associated with obtaining a higher density and better utilization of the module wafer surface leads to usage of Mylar type capacitors in a manner which requires a new wafer component construction which utilizes the wafer printed circuitry so as to provide common terminals for the Mylar capacitors and other components on the wafer such as resistors and the corollary problem of obtaining a miniature Mylar capacitor at an economical cost and of size small enough so that it will fit on the smaller type wafers, for example, the miniature wafer. This latter problem is a problem of some severity.

In trying to obtain a Mylar capacitor having a roll length or "size" dimension of, for example, ¼ of an inch, several interrelated problems are encountered. The electrode foils, when made in a width dimension of less than ¼ of an inch, do not have sufficient mechanical strength so that they can be physically handled by winding apparatus in an economical manner. Under present day techniques it is virtually impossible to wind a capacitor of ¼ inch size as a discretely individual unit, because of the weave and stray of the electrode foils and dielectric tapes and because the mechanical properties of the foils (which are necessarily less than ¼ of an inch in width) and tapes as well as tolerances etc. are such that it might be fairly stated that a ¼ inch capacitor is "too small" to be handled as an individual winding unit. The overcoming of the problems of manufacturing a miniature wound capacitor and the providing of a high component density electronic package forms the general object of this invention.

It is an object of this invention to provide a method of making a wound capacitor which is "too small" to be wound as an individual unit.

It is a further object of this invention to provide a method of making a family of capacitors of different voltage ratings, all of said capacitors having the same outside miniature length of roll size which is "too small" to be wound as an individual unit.

Another object of this invention is to provide a method of attaching a particular lead for attachment of the wound miniature capacitor to a wafer module.

It is still another object of this invention to provide a method of obtaining high component density on a module wafer by utilizing common printed terminals for both one end of a flat resistor and at least one end of a wound capacitor.

Another object of this invention is to provide an electrical structure of high density comprising a thin wafer having conductive coatings at spaced points, flat carbon tape resistors mounted on the wafer, and rolled miniature capacitors physically overlying the resistors with one end of the resistors and the capacitors each being electrically connected to a common printed terminal on the wafer.

The novel features that are characteristic of this invention are set forth with particularity in the appended claims. The invention itself, however, both as to its organization and its method of operation, together with additional objects and advantages thereof will best be understood by the following description of specific embodiments when read in connection with the accompanying drawings in which:

FIG. 8 is a perspective view of a modular wafer having printed circuitry on the surfaces thereof and riser wire notches on the periphery;

FIG. 8A is a slightly enlarged view of the reverse face of the wafer shown in FIG. 8 the location of resistors thereon being shown in dotted lines;

FIG. 9 is an isometric perspective view similar to FIG. 8 showing a later stage of the assembly operation on the first face of the wafer wherein carbon tape resistors are placed over various portions of the printed circuitry of the first face of the wafer shown in FIG. 8;

FIG. 10 is a view similar to FIGS. 8 through 9 showing the first face of the wafer with the assembly of rolled capacitors over the carbon tape resistors shown in FIG. 9;

FIG. 10A is a view of the reverse face of the wafer shown in FIG. 8A showing carbon tape resistors and capacitors assmbled thereto;

FIG. 11 is a sectional view along lines 11—11 of FIG. 10A;

FIG. 12 is a perspective view showing how more than one wafer may be aligned in parallel array on riser wires;

FIG. 13 is a perspective view showing of a modular wafer with the electronic components thereon and with riser wires attached thereto being totally encapsulated in a suitable riser potting compound or the like so that only the riser wires protrude;

FIG. 14 is a chart showing the electrical connections for eighteen (18) circuits on the single wafer shown in FIGS. 8 through 11, there being only twelve (12) riser wires associated with the periphery of the wafer.

Figures 1, 2, 3, 3A, 3B, 3C, 4, 5, 6, 7:
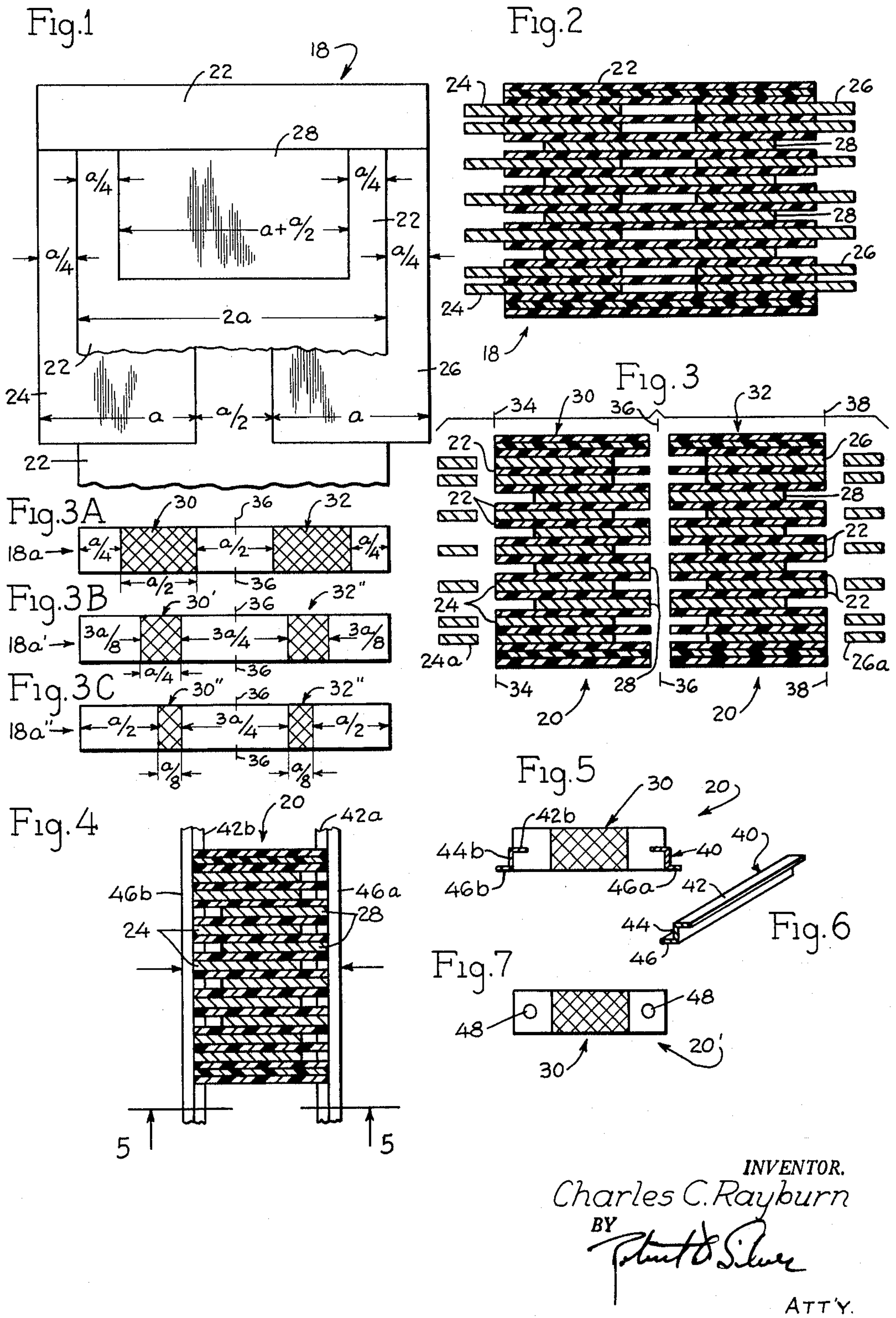
FIG. 1 is a plan view of a partially rolled capacitor, various layers being broken away to illustrate the disposition of the various electrode foils and the dielectric tapes.
FIG. 2 is a semidiagrammatic sectional view through a capacitor constructed as shown in FIG. 1.
FIG. 3 illustrates the next step in forming two capacitors from the capaictor roll shown in FIG. 2.
FIGS. 3A through 3C are semidiagrammatic showings of the relative relationships of the width of overlap of various electrode foils after a roll such as shown in FIG. 2 has had the extending portions of the foils sheared flush with the dielectric tapes but prior to the center cut.
FIG. 4 is a view of one of the capacitors formed in FIG. 3 showing the application of the leads of the type shown in FIG. 6.
FIG. 5 is a semidiagrammatic showing of the capacitor of FIG. 4 taken along lines 5—5 of FIG. 4.
FIG. 6 is an isometric perspective view of one form of lead which is particularly adapted to be associated with the ends of the capacitors foils to enhance assembly to the wafer shown in FIGS. 8 through 13.
FIG. 7 is a view similar to FIG. 5 showing a different type of lead assembled to one of the capacitors formed in FIG. 3, when same is to be used in a different environment.

Before discussing the modular assembly 94 shown in FIG. 13 it will perhaps be helpful to discuss the method of making the rolled capaictors mounted in assembly 94 which are "too small" to be handled by present day techniques. I have found that structurally, the practical minimum width of a capacitor foil for electrode use is ¼ of an inch. Obviously this dimension may be deviated from by a small margin, but for practical purposes ¼ of an inch just barely supplies sufficient mechanical strength and handability to enable the foil to be wound on conventional winding machinery. For convenience of discussion, I have used the dimension "*a*" in the drawings, said dimension "*a*" being in the range of ¼ to ⅜ inch.

The capacitors such as 20 and 20′ shown in FIGS. 5 and 6 are formed by rolling in convoluted fashion, a roll 18 which is slightly larger than double size the final desired length of the individual capacitors 20. More particularly, a pair of tapes 22 for roll 18 are preferably formed of a dielectric material such as polyethylene terephthalate (Mylar) and of a gauge in the range of 25 to 100 in thickness and having a width dimension substantially equal to $2a$ are most suitable for the desired results. Various other plastic material dielectric tapes are also suitable. A pair of electrode foils 24 and 26 are placed intermediate the first opposed surfaces of the tapes 22 in roll 18, each of the electrodes 24 and 26 having a dimension "*a*." These electrode foils 24–26 may be of any conventional material such as tin foil or the like.

As shown in FIG. 1, the adjacent edge surfaces of the foils 24–26 are spaced apart a dimension equal to $a/2$ so that the outboard edges of each of the foils extend beyond the corresponding edges of the dielectric tapes by a dimension $a/4$. A third electrode foil 28 is disposed between the second opposed surfaces of the dielectric tapes 22 in overlapping arrangement to each of the foils 24 and 26, foil 28, of course, being separated from the foils 24 and 26 by the thickness of one of the dielectric tapes 22. The areas of overlap have been respectively designated as 30 and 32, which are shown semidiagrammatically as a cross hatcher area in FIG. 3A. It will be noted that foil 28 has a width dimension substantially equal to $3a/2$ and it is symmetrically arranged in the roll 18 so that the midpoint thereof is on the midpoint of the dielectric tapes 22. Thus the edge surfaces of the foil 28 are spaced from the closely adjacent dielectric tape edges by a dimension of $a/4$ on each side. After the tapes and foils have been wound into a roll 18 of suitable number of turns, depending upon the voltage value desired, a cross section along the axis of the roll will show a structure as semidiagrammatically depicted in FIG. 2. The roll 18 shown in FIG. 2 is similar in many respects to that shown in my Patent No. 2,949,570 aforementioned except for the dimensions involved. However, in that patent the roll 18 was the finished product, whereas in the instant situation this is an intermediate step to the final product.

After forming the capacitor roll 18, it is subjected to three shearing cuts along lines 34, 36 and 38, as shown in FIG. 3 to produce two identical capacitors 20. As can be seen in FIG. 3, the cut line 34 shears off the extending edges of the foil 24 to leave scrap 24*a* and the cut line 38 shears off the edges of foil 26 which are outboard of the tapes 22 to leave scrap 26*a*. The cut line 36, being exactly on the midpoint of foil 28 and the tapes 22, presents two capacitors 20 each having a dimension "*a*." Due to the geometry as shown in FIG. 1 and aforediscussed, foil 28 adjacent to the cut 36 is flush with the edge of the newly formed dielectric tape edges on the inboard sides of each of the newly formed capacitors 20 whereas the outboard edges of the tape 22 extend a dimension equal to $a/4$ beyond the outboard edges of the foil 28. Similarly, foil 24 is flush with the outboard edge of the tape 22 in the left hand capacitor 20 of FIG. 3 and the inboard edge of foil 24 is spaced a dimension of $a/4$ from the newly cut edge in the tape 22 on the inboard side of the capacitor. The same considerations apply relative to foil 26 in the right hand capactor 20 of FIG. 3. The two capacitors 20 thus formed in FIG. 3 are identical and symmetrical. The areas of overlap of foils 30 and 32 which provide capacitance, each have a dimension of $a/2$ and the capacitance rating of the individual capacitors is determined by the number of turns in the foil. After cutting, the capacitor foils 24–26–28 each have a dimension of $3a/4$ in the capacitors 20. When it is considered that the dimension "*a*" is in the range of ¼ to ⅜ of an inch as aforestated and preferably at ¼ of an inch, the advantages of this system will be apparent.

In FIG. 3B a similar method of forming a capacitor is illustrated semidiagrammatically, the areas of overlap 30′ and 32′ being different to establish different voltage and capacitance ranges in a family of capacitors of the same basic size "*a*." To form two capacitors which are symmetrically identical from the roll construction 18′ shown in 3B, the roll **18*a*′ is merely cut on cut line 36. Roll 18′ of FIG. 3B is a semidiagrammatic showing of foils and end electrodes wound as shown in FIG. 1 after the extending end portions (such as 24*a* and 26*a*) of the foils have been cut, but prior to the cut along line 36. In the roll 18′ the foils 24 and 26** are of the same initial dimension "*a*," but are initially spaced apart at adjacent edges by a dimension of $3a/4$. The so-called floater electrode foil 28 is symmetrically aligned on the dielectric tapes but has an initial dimension of $5a/4$, thus the areas of overlap of the foils, i.e. areas 30′ and 32′ are a dimension $a/4$ and the areas of overlap are equally spaced from the end surfaces of the capacitor after the cut along line 36.

FIG. 3C illustrates a still different spacing and dimensioning of the electrode foils in the winding technique similar in general respects to that shown in FIGS. 1 and 3A in that a pair of capacitors will be formed having a size dimension "*a*." However, there are differences in the finally formed capacitors as shall now be discussed. To form the capacitor roll **18*a*″ shown in FIG. 3C the extending end foils 24 and 26** are still of the width dimension "*a*" and are spaced apart at adjacent edge surfaces by a dimension $3a/4$. The so-called floating foil 28 is symmetrically arranged on the midpoint of the tapes 22 and is also of a width dimension "*a*" to provide areas of overlap 30″ and 32″ which are equal to $a/8$. Upon cutting the roll **18*a*″ to form the two capacitors, it will be noted that the areas of overlap 30′ and 30″** are not aligned with the midpoints of the new individual capactors so formed. This may be compensated for in the final product in two manners, i.e. by shearing off still further portions of the outboard edges of the two capacitors so that an equal area remains outboard to the overlap areas, or the leads may be affixed to the end surfaces in such a manner (not shown) so that they are equally spaced on opposite ends of the capacitor from the overlap area. This latter technique is available where certain other processing requires a constant dimension such as "*a*" for uniformity of size of product for handling by automatic apparatus. The capacitors formed by cutting roll **18*a*″** have a distinct disadvantage, however, in that they are not symmetrical.

The individual capacitors 20 after forming thereof are adapted to be electrically connected to lead members 40 by the technique taught in my copending application entitled Wound Capacitor, Serial Number 756,121, dated August 20, 1958, new Patent No. 3,040,415. The electrical lead member 40 is somewhat Z-shaped in cross section having a horizontal portion 42, a vertical portion 44, and another horizontal portion 46 substantially coplanar with portion 42. By electrically heating lead members 40, the portion 42 thereof may be forced inwardly into contact with the electrode foils as shown in FIG. 4 adjacent to the end surfaces of the capacitor 20 to form a good electrical and physical bond to the foils and to the dielectric tapes all as is taught in the aforementioned pending application. By utilizing the Z-shaped in cross section lead members, it will be apparent, as shown in FIG. 5, that portions 46 are disposed adjacent to the bottom of the rolled capacitor making for easy electrical connection to printed circuitry as shall be described. It will be obvious there are various other forms of electrical lead means 40 that will perform the same functions, one such being a U-shaped in cross section member (not shown).

In FIG. 7 a capacitor 20′ is shown which is substantially similar to that shown in FIG. 5 except that a wire lead member has been inserted in accordance with the practices taught in my aforementioned patent application. The capacitor 20′ in the form shown in FIG. 7 has independent usefulness such as on conventional circuit boards and in hand wiring operations etc. whereas the capacitor 20 has a particular adaptation to the mounting upon a wafer in overlying relationship to resistors as shall now be discussed.

The wafer 50 per se, shown in FIGS. 8–11 forms no part of the instant invention, said wafer being shown and described in a copending application of James G. Black Jr. filed the 23rd day of November 1960, having Serial No. 71,302, now Patent No. 3,078,335 and assigned to the same assignee. Wafer 50 essentially comprises a thin steatite wafer which is essentially rectilinear in plan view having corner orientation means 52 and 54 as shown and as more fully discussed in the copending application aforementioned. The wafer is formed with notches 56 through 78 in the side edges thereof adapted to receive corresponding riser wires **56*a* through 78*a*** (see FIG. 12). Electrical printed circuitry, in the forms of spaced terminals are associated with the riser wire notches as shown. The printed circuitry terminals on the faces of the wafer have been designated with the same reference numerals associated with a notch to which the printed circuit is connected with the addition of a suffix *c*. FIGS. 8, 9 and 10 all show the same face of the wafer and FIGS. 8A and 10A show the reverse face of the wafer. One form of electrical printed circuitry is shown on the first face of the wafer in FIG. 8. As shown in FIG. 9, a plurality (3) of flat carbon tape resistors which are quite thin in cross section, and are numbered 82 to 86, are disposed across various printed circuit terminals. As can be seen in the graph in FIG. 14, five (5) different resistor circuits are formed by the three resistor tapes 82, 84 and 86. This obtains since resistor 86 has multiple connections of varying lengths such that one resistance value 86 is incurred between the terminals associated with notch 64 and notch 74, a second resistance value **86*a* is incurred between terminals to notch 64 and notch 70 and a third resistance value 86*b* is obtained between the terminals of notch 70 and notch 74. The tapes 82 and 84** are shown as single value resistances.

Capacitors **20*a*, 20*b* and 20*c* are disposed in overlaying engagement to the resistors 82 through 86 as shown in FIGS. 10 and 11. Capacitor 20*a* is connected across the terminals to notches 62 and 78, capacitor 20*b* is connected across the terminals to notches 64 and 76, and capacitor 20*c* is connected across the terminals to notches 68 and 74. It will be observed that resistors 84 and 86 are respectively electrically common to terminal connections with notches 62 and 64** respectively. Thus, at least some of the capacitors and resistors on the same face of the wafer have a common printed terminal.

On the reverse face of the wafer as shown in FIGS. 8A and 10A and as also shown in FIG. 11, three more resistors 88, 90 and 92 are disposed across respective printed circuitries and three more capacitors **20*d*, 20*e* and 20*f* of the rolled Mylar type are disposed in overlying relationship thereto. It will be noted that resistor 92 forms in effect three separate resistances due to the connections as shown by the chart in FIG. 14. Thus, as appears from chart 14, there are a total of eighteen (18) electrical component circuits on the two faces of the wafer with only twelve (12) riser wires to be associated with the twelve (12) notches. While there is a maximum possibility of 66 circuits between the twelve (12) riser wires, it is found that in point of practice it is practically impossible to obtain that many on a single wafer due to geometry, space and thermal problems. As can be seen in FIGS. 10A and 11, the particular leads 46 of the capacitors are well adapted to mounting the capacitors over the resistor tapes by conventional soldering techniques. The size of the wafer 50 illustrated is approximately ½ of an inch on a side and thus the necessity for usage of a miniature capacitor 20** as afore-described having a length dimension of "*a*."

In some cases it is desired to have more than one wafer in a stack such as shown in FIG. 12 thus the wafer 50 is disposed above a second wafer **50*a*** which is in parallel array thereto. This may be continued until all 66 circuits are used.

After mounting of the components as shown in FIG. 12 or as shown in FIG. 11 and after assembly of the riser wires to the notches in the periphery by prior art techniques, the single wafer or more than one wafer may be conveniently potted in a suitable resinous compound 96 to give a structure such as shown in FIG. 13. This finally finished component 94 forms a rigid, high component density, modular package which has good durability, reliability, and structural and electrical integrity.

Although various embodiments of the invention has been shown and described, it is with full awareness that many modifications thereof are possible. Therefore, the invention is to be construed in the light of the prior art and in the spirit of the appended claims.

What is claimed as the invention is:

1. The method of making a miniature wound capacitor of size "*a*," too small to be wound as an individual unit wherein "*a*" is a dimension in the range of 0.25 to 0.375 inch comprising the steps of convolutely winding into a roll first and second dielectric tapes of a width of "2*a*" and first, second and third electrode foils, said first and second electrode foils being identical in size and being arranged and disposed in the same plane between first opposed surfaces of said dielectric tapes with the adjacent edges thereof spaced apart a dimension not less than $a/2$ and the width of said first and second foils being not less than "*a*" so that outboard edges of each of said first and second electrode foils extend an equal distance beyond the outboard edges of said first and second dielectric tapes, said third electrode foil being arranged and disposed between second opposed surfaces of said dielectric tapes in overlapping arrangement to each of said first and second electrode foils and spaced therefrom by the thickness of one of said dielectric tapes, said third electrode foil having a width dimension not less than dimension "*a*" and not greater than $3a/2$ and disposed such that the midpoint of said third electrode foil is on the midpoint of said dielectric foils and the area of overlap to said first and second electrode foils is identical; after winding into a convoluted roll, shearing the roll transverse to the axis adjacent to each of the outboard edges of said dielectric tapes and at the midpoint of said dielectric tapes to provide two identical capacitor rolls each of a size "*a*" and with each having end surfaces comprised of flush edges of electrode and dielectric tapes.

2. The method set forth in claim 1 wherein the dimension "*a*" is equal to ¼ of an inch.

3. The method set forth in claim 1 wherein electrode wires are disposed transversely across the end surfaces of each of the two identical capacitor rolls to contact an electrode foil adjacent thereto.

4. The method of making a miniature wound capacitor of size "*a*," too small to be wound as an individual unit comprising the steps of convolutely winding into a roll first and second dielectric tapes of a width of 2*a* and first, second and third electrode foils, said first and second electrode foils being identical in size and being arranged and disposed in the winding operation in the same plane between first opposed surfaces of said dielectric tapes with the adjacent edges thereof spaced apart a dimension not less than $a/2$ and the width of said first and second foils being not less than "*a*" so that outboard edges of each of said first and second electrode foils extend an equal distance beyond the outboard edges of said first and second dielectric tapes, said third electrode foil in the winding operation being arranged and disposed between second opposed surfaces of said dielectric tapes in overlapping arrangement to each of said first and second electrode foils and spaced therefrom by the thickness of one of said dielectric tapes, said third electrode foil having a width dimension not less than dimension "*a*" and not greater than $3a/2$ and disposed such that the midpoint of said third electrode foil is on the midpoint of said dielectric foils and the area of overlap to said first and second electrode foils is identical; after winding into a convoluted roll, shearing the roll transverse to the axis adjacent to each of the outboard edges of said dielectric tapes and at the midpoint of said dielectric tapes to provide two idenical capacitor rolls each of a size "*a*" and with each having end surfaces comprised of flush edges of an electrode foil and a dielectric tape, the individual electrode foils in each of said capacitors of size "*a*" having a width dimension of less than the dimension "*a*"; placing heated configured electrical contact members transversely against the sheared end surfaces of each of said capacitor rolls of size "*a*" and forcing same inwardly so that at least one portion of the contact members extends within said end surface in electrical and physical engagement with the electrode foil adjacent thereto and with another portion being disposed therebelow substantially parallel with said first portion and parallel with a diametrical plane through the axis of said roll.

References Cited by the Examiner

UNITED STATES PATENTS

| | | | |
|---|---|---|---|
| 2,752,537 | 6/1956 | Wolfe | 317—101 |
| 2,850,681 | 9/1958 | Horton | 317—101 |
| 2,877,389 | 3/1959 | Wiener | 317—101 |
| 2,963,771 | 12/1960 | Clemons | 29—25.42 |
| 2,984,768 | 5/1961 | Henry | 317—101 |
| 2,989,665 | 6/1961 | Khouri | 317—101 |
| 3,040,415 | 6/1962 | Rayburn | 29—25.42 |

WHITMORE A. WILTZ, *Primary Examiner.*

JOHN P. WILDMAN, *Examiner.*